United States Patent [19]

Suzuki et al.

[11] Patent Number: 4,900,938
[45] Date of Patent: Feb. 13, 1990

[54] METHOD OF TREATING PHOTORESISTS

[75] Inventors: Shinji Suzuki; Hiroko Suzuki, both of Kawasaki; Tetsuji Arai, Yokohama, all of Japan

[73] Assignee: Ushio Denki, Tokyo, Japan

[21] Appl. No.: 336,268

[22] Filed: Apr. 12, 1989

Related U.S. Application Data

[62] Division of Ser. No. 149,301, Jan. 28, 1988.

[30] Foreign Application Priority Data

Mar. 20, 1987 [JP] Japan ................................ 62-63978
Mar. 20, 1987 [JP] Japan ................................ 62-63979

[51] Int. Cl.$^4$ ......................... G03F 7/02; H01L 21/30
[52] U.S. Cl. ............................. 250/442.2; 250/492.1
[58] Field of Search ................. 250/492.2, 492.1, 453.1

[56] References Cited

U.S. PATENT DOCUMENTS

| | | | |
|---|---|---|---|
| 4,253,888 | 3/1981 | Kibuchi | 156/643 |
| 4,417,948 | 11/1983 | Mayne-Banton et al. | 250/492.1 |
| 4,548,688 | 10/1983 | Matthews | 204/157.18 |
| 4,613,404 | 9/1986 | Tabei | 148/187 |
| 4,749,436 | 6/1988 | Minato et al. | 156/343 |

FOREIGN PATENT DOCUMENTS

63-276224 11/1988 Japan ................ 250/492.1

OTHER PUBLICATIONS

H. Hiraoka and J. Pacansky; J. Vac. Sci. Tech., 19 (1981), p. 1132.
H. Hiraoka and J. Pacansky: J. Electrochem. Soc., 128 (1981), p. 2645.
R. Allen et al: J. Electrochem. Soc., 129 (1982), p. 1379.
J. C. Matthews and J. I. Willmott, Jr.: Microllithography III, SPIE, (1984).
Y. Takasu et al.: Proc. Dry Process Symposium, (1984), p. 60.
H. Yanazawa et al.: J. Appl. Polymer Sci., 30 (1985), p. 547.

*Primary Examiner*—Jack I. Berman
*Attorney, Agent, or Firm*—Armstrong, Nikaido, Marmelstein, Kubovcik & Murray

[57] ABSTRACT

A method of treating positive photoresist materials applied on a semiconductor wafer placed on a support, which meets the demand for high-speed treatment and improvement in heat-resistance and plasma-resistance of the developed positive photoresist image. The developed positive photoresist image is exposed to radiant lights including ultraviolet rays in an chamber filled with gas in which oxygen and/or moisture are reduced or not included.

1 Claim, 1 Drawing Sheet

METHOD OF TREATING PHOTORESISTS

This is a division of application Ser. No. 149,301 filed Jan. 28, 1988.

BACKGROUND OF THE INVENTION

1. Field of the Invention

This invention relates to a method of treating photoresist materials applied on semiconductor wafer and, more particularly, to a method of treating the photoresist materials employing ultraviolet radiation.

2. Description of the Prior Art

As for the prior-art treatment of a photoresist employing ultraviolet radiation, exposing the photoresist to ultraviolet radiation is utilized in a treatment in which a mask pattern is formed by exposing the photoresist image applied on a semiconductor wafer, in a preliminary cleansing treatment in which organic pollutants sticking on the surface of the semiconductor wafers are dissolved and cleansed away, etc., and recently attention has been paid to the application of this method to particular treatments of photoresists such as baking photoresist materials.

In the manufacture of semiconductor devices, a process of forming a photoresist pattern is executed in the sequence of the application of a photoresist material, prebaking, exposure, development and postbaking, when roughly divided. The postbaking process is a heating process executed for improving the adhesiveness of the photoresist to a semiconductor substrate, heat-resistance, etc. Thereafter, ion implantation, or plasma-etching of a silicon oxide film, a silicon nitride film, an aluminum film, etc., which are formed beforehand on the surface of a semiconductor wafer prior to the application of the photoresist material, is executed by using the photoresist pattern. On the occasion, it is preferable that the photoresist has a high heat-resistance, since the temperature thereof rises in the process of ion implantation, while it is requisite that the photoresist shows a durability not allowing "film erosion" in the processof plasma-etching. However, a photoresist material of high resolution, which has been used in recent years as semiconductor devices are highly integrated and made highly fine, is of a positive type, and the photoresist of this type is generally inferior in the heat-resistance to the one of a negative type.

With a view to enhancing the heat-resistance and plasma-resistance of the photoresist, examinations and studies are made on a method in which a photoresist material is heated gradually to an elevated temperature for a sufficient time in postbaking, and a method in which ultraviolet radiation are applied to a photoresist pattern after development thereof. These method are described in a reference of H. Hiraoka and J. Pacansky: J. Vac. Sci. Tech. 19(1981).

The former method, however, has a fault that it fails to ensure satisfactory heat-resistance and plasma-resistance and requires to expose the photoresist to ultraviolet radiation for a considerably long time. The latter method, on the other hand, has a fault that, although the heat-resistance temperature thereof is raised by exposing the photoresist to ultraviolet radiation, ultraviolet rays do not penetrate to the depth of a film of photoresist material when it is thicker, which results in an insufficient improvement in the heat-resistance of the entire film of photoresist material and requires a considerably long exposure time.

In view of these faults, a method of combination of "heating" with "ultraviolet radiation" has been proposed recently, as is disclosed in Japanese Unexamined Patent Publication ("KOKAI KOHO" in Japan) 60-45247 (U.S. Application No. 497,466) titled "hardening of Photoresist and Apparatus", for instance. This method, however, is unable to meet the demands for a short exposure time when those photoresists is thick. Namely, an organic compound prevailingly used in photoresist materials, reacts readily to oxygen gas or moisture by being exposed to ultraviolet rays. It is known that the photoresist which was made to react with oxygen or moisture is inferior in the heat-resistance and the plasma-resistance.

Accordingly, in the method of treating photoresists employing ultraviolet radiation which meets the demand for improvement in the heat-resistance and the plasma-resistance, the degree of polymerization of the photoresist increases by ultraviolet radiation, therefore the heat-resistance and the plasma-resistance of the photoresist may be improved. The photoresist, however, is oxidized by ultraviolet radiation, therefore photoresist is inferior in the heat-resistance the plasma-resistance. And polymerization of the photoresist is suppressed by oxygen and moisture in the atmosphere or moisture captured in the photoresist, too. Therefore, this is one of causes for being unable to shorten a exposure time.

When a ultraviolet light is applied to the photoresist, however, a gas is generated from the photoresist and this gas causes the formation of bubbles, deformation of a photoresist pattern and deformation of a photoresist film, such as exfoliation, rupture or roughening thereof, thus causing imperfections of a semiconductor element.

As described above, the prior-art methods for particular treatments of the photoresist, such as hardening the photoresist material employing ultraviolet radiation, have left unsettled the problems that a long exposure time for ultraviolet radiation is required for the treatment and that the improvement in the heat-resistance is insufficient in the base portion of the photoresist film when this film is thick, though they have been able to achieve some improvements in the heat-resistance and plasma-resistance. In other words, there has been left unsettled a problem that the whole treatment of the photoresist can not be performed in an organic and effective manner.

And, when a ultraviolet light is applied to the photoresist, a gas is generated from the photoresist, and this gas causes the formation of bubbles, deformation of a photoresist pattern and deformation of a photoresist film, such as exfoliation, rupture or roughening thereof, thus causing imperfections of a semiconductor element.

SUMMARY OF THE INVENTION

An object of this invention is to perform the high-speed treatments of positive photoresist.

Another object is to provide a method enabling the effective treatment of positive photoresist by preventing the breakdown of the developed positive photoresist image on a wafer which is caused by ultraviolet radiation.

This invention provides a method of treating positive photoresist materials applied on a semiconductor wafer, which meets the demand for high-speed treatment and improvement in heat-resistance and plasma-resistance of the developed positive photoresist image on a semiconductor wafer.

In particular, this invention is concerned with treating said image by exposing to ultraviolet radiation in gas in which oxygen and moisture are reduced or not included under 1 atmospheric pressure or below.

In this way, the positive photoresist material reacts with little oxygen in gas and little moisture in gas when the developed positive photoresist image is exposed to ultraviolet radiation. Accordingly, the degree of oxidization of the photoresist material is suppressed and it is decrease that polymerization of the photoresist materials is suppressed by oxygen and moisture.

And, when ultraviolet light is applied to the the developed positive photoresist image in gas of lower pressure than 1 atmospheric pressure, gas is generated from the photoresist materials at once. Accordingly, the said image may be preserved from deformation caused by the formation of bubbles.

DESCRIPTION OF THE PREFERRED EMBODIMENT

Figure 1:
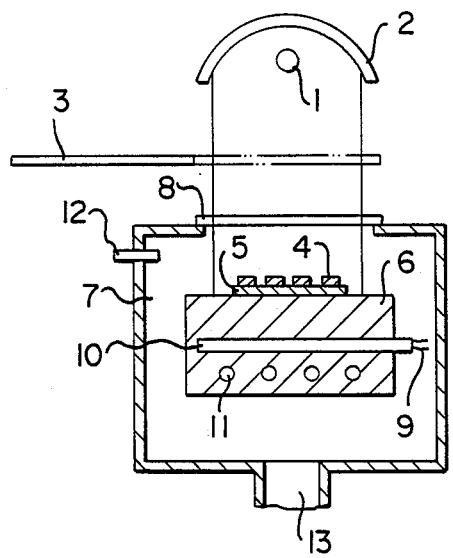
FIG. 1 shows a cross section of an apparatus of treating photoresists image for explaining one embodiment of a method of treating photoresists image according to this invention and, FIG. 2 shows a cross section of an apparatus of treating photoresists for explaining another embodiment of a method of treating photoresists image according to this invention.

A preferred embodiment of the invention will be described hereinafter with reference to the accompanying drawings in which FIG. 1 is illustration of an embodiment of an apparatus for executing method of treating the developed positive photoresists image on a wafer according to this invention.

Pattern of photoresists image 4 is formed on a semiconductor wafer 5, which is placed on a support 6. The support 6 is heated by a heater 10 connected with power supply through a heater lead wire 9, or cooled down by cooling water to flow through a cooling conduit 11. The temperature of the semiconductor wafer 5 is controlled by these heating and cooling mechanisms. Ultraviolet radiation source is composed of a high pressure mercury lamp 1, a concave mirror 2, and a shutter 3 which can be opened and closed. Radiant light containing ultraviolet rays, which are emitted from the high pressure mercury vapor lamp 1, are reflected by the concave mirror 2 and projected onto those photoresists image 4 through the shutter 3 and a window 8. A treating chamber 7 is provided with an intake 12 to draw in inactive gases and exhaust hole 13 to be connected to vacuum pump (not to be illustrated).

Next, a description will be made on a method of treating photoresists image by using this apparatus of treating photoresists image. The semiconductor wafer 5, on which pattern of photoresists image 4 is formed, is placed on the support 6. The air in a treating chamber 7 is exhausted by a vacuum pump through the exhaust hole 13, and oxygen and moisture are removed from the space in said chamber. Next, inactive gas such as Ar is took in said space through the intake 12. Then the shutter 3 being opened in this state, the light emitted from the high pressure mercury vapor lamp 1 is projected onto the developed positive photoresists image 4. And the temperature of the support 6 is controlled, concretely explaining, the support 6 is heated by the heater 10 connected with power supply through the heater lead wire 9, or cooled down by cooling water to flow through the cooling conduit 11, and then the temperature of the semiconductor wafer 5 placed on the support 6 is controlled, too.

When the treatment of the developed positive photoresist image is ended, heating is stopped, the shutter 3 is closed, and the exposure to the ultraviolet radiation is stopped. Then, cooling water is flown through the cooling conduit 11 to cool the semiconductor wafer 5 down to a prescribed temperature, and the gas pressure in a chamber is returned to the normal atmospheric pressure and then the semiconductor wafer 5 is removed from the support 6. After the treatment of photoresists image on a wafer is completed, the abovedescribed process may be repeated so as to treat photoresists image on a next wafer in sequence.

The following is a more concrete description of the method of treating photoresists.

The semiconductor wafer 5 is placed on the support 6 which is heated beforehand to be kept at a temperature of 100° C. In this case, the used positive photoresist is TSMR-8800 (made by Tokyo Ohka Kogyo Corp.) and the thickness is 3.5 μm. The heat-resistance temperature of said positive photoresist is 110° C.

Next, the air in the treating chamber 7 is exhausted through hole 13 and is evacuated to such a low pressure as $10^{-3}$ torr. Then an inactive gas such as Ar is took in through the intake 12, and the treating chamber 7 is filled with the inactive gas of about 1 atmospheric pressure. In this state, the shutter 3 being opened, the light emitted from the high pressure mercury vapor lamp 1 is projected onto the photoresists image 4. And, the support 6 is heated to 140° C. in the appointed temperature gradient and is kept at the temperature of 140° C. for the appointed period. When the treatment of the photoresist image is ended, heating is stopped, the shutter 3 is closed, and the exposure to the ultraviolet radiation is stopped. In this embodiment of the inventions, the exposure time to ultraviolet radiation in order that the heat-resistance temperature is raised to 250° C. is 90 seconds and the time of the exposure to the ultraviolet radiation in this embodiment was 30% in comparison with the time in the prior-art.

Another embodiment of this invention involves a treatment of the photoresist image in which the photoresist image is exposed to ultraviolet radiation in air of lower pressure than atmospheric pressure.

After the semiconductor wafer 5 is placed on the support 6, the air in the treating chamber 7 is exhausted by a vacuum pump through the exhaust hole 13, and is evacuated to such a low pressure as $10^{-3}$ torr, and then Ar gas is took in through the intake 12. At this time, the internal pressure of the testing chamber 7 is such a pressure as 100 torr by controlling the speed of taking in Ar gas. In this state, the shutter 3 being opened, the light emitted from the high pressure mercury vapor lamp 1 is projected onto the photoresists image 4. After the shutter 3 is opened, the above-described process may be repeated so as to treat the photoresists image on a next wafer in sequence. In this embodiment, the exposure time to ultraviolet radiation in order that the heat-resistance temperature is raised to 250° C. is seconds and the time of the exposure to the ultraviolet radiation in this embodiment was 20% in comparison with the time in the prior-art.

Figure 2:
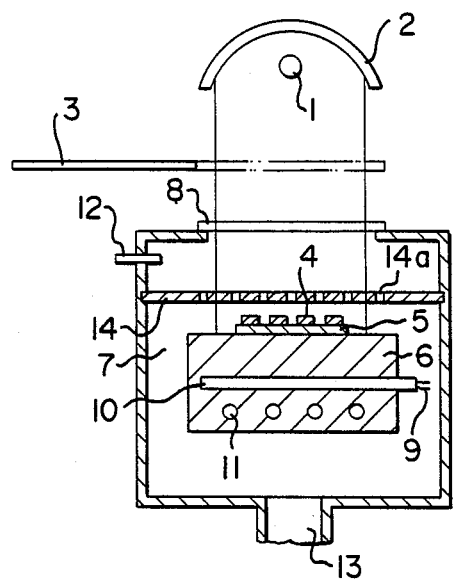

FIG. 2 shows an illustration of another embodiment of an apparatus for executing a method of treating photoresists image according to this invention. In this figure, 14 is a porous plate in which many holes 14a are made at regular intervals. These holes of diameter about 0.6 mm are arranged with distances between them of about 4 mm. Less volatile matters, which are generated from the positive photoresist, are prevented from sticking to the porous plate 14 or the window 8 by the inactive gas flowing through said holes.

In this embodiment, a porous plate in which many holes are made at regular intervals is used. But another means to keep volatile matters from sticking to the porous plate or the window may be employed. For example, a porous plate in which many slits are made at regular may be used as well. In case of a small window, only one or more intakes may be used as well. Namely, something to make a flow of gas may be used as well.

In these above-mentioned embodiments, after the semiconductor wafer is placed on the support, the air in the treating chamber is exhausted. A method of exhausting the air from the treating chamber before the semiconductor wafer is placed on the support may be used as well by equipping a preparatory exhaust room next to the treating chamber.

And, a high pressure mercury vapor lamp is used as a light source, but another light source may be employed. For example, a low pressure mercury vapor lamp, a metal vapor lamp in which metal vapor in the form of halide and inactive gas are sealed, or a microwave-excited electrodeless discharge lamp may used as well.

And, in case of coating a thick positive photoresist film on a wafer, large amounts of gases are generated from the positive photoresist. In this case, if the photoresist image is exposed to weak radiant lights including ultraviolet rays at the beginning and then to stronger radiant light little by little or step by step, gases generated from the photoresists image may be released in the treating chamber out of the photoresist.

What is claimed;

1. An apparatus for treating a developed positive photoresist image on a semiconductor wafer comprising:
    an ultraviolet radiation source composed of a metal vapor lamp or a metal halide vapor lamp and a mirror;
    a treating chamber having:
        a window to permit the radiant light from said ultraviolet radiation source to pass into said treating chamber;
        an intake to permit inactive gas to be drawn into said treating chamber;
        an exhaust hole to permit said inactive gas to be exhausted from said treating chamber;
        a porous plate placed within said treating chamber to separate said window and said intake from said exhaust hole;
        a support for a semiconductor wafer having a developed positive photoresist image thereon provided with temperature control mechanism within said treating chamber;
    wherein the radiant light is projected to a developed positive photoresist image on a semiconductor wafer through a window and a porous plate and wherein inactive gas is directed from an intake to an exhaust hole through a porous plate.

* * * * *